United States Patent
Yamamoto et al.

(10) Patent No.: US 10,505,387 B2
(45) Date of Patent: Dec. 10, 2019

(54) WORK UNIT POWER SUPPLY DEVICE

(71) Applicant: FUJI CORPORATION, Chiryu-shi (JP)

(72) Inventors: Mizuho Yamamoto, Okazaki (JP); Shingo Fujimura, Toyoake (JP)

(73) Assignee: FUJI CORPORATION, Chiryu-shi (JP)

( * ) Notice: Subject to any disclaimer, the term of this patent is extended or adjusted under 35 U.S.C. 154(b) by 51 days.

(21) Appl. No.: 15/580,697

(22) PCT Filed: Jun. 23, 2015

(86) PCT No.: PCT/JP2015/068013
§ 371 (c)(1),
(2) Date: Dec. 8, 2017

(87) PCT Pub. No.: WO2016/207972
PCT Pub. Date: Dec. 29, 2016

(65) Prior Publication Data
US 2018/0191193 A1 Jul. 5, 2018

(51) Int. Cl.
*H02J 9/00* (2006.01)
*H05K 13/02* (2006.01)
(Continued)

(52) U.S. Cl.
CPC .............. *H02J 9/005* (2013.01); *H05K 13/02* (2013.01); *H05K 13/04* (2013.01);
(Continued)

(58) Field of Classification Search
CPC ....................................................... H02J 9/005
See application file for complete search history.

(56) References Cited

U.S. PATENT DOCUMENTS 4,233,598 A * 11/1980 Green ................... G08B 25/00
340/524
6,701,611 B1 3/2004 Izumida et al.
(Continued)

FOREIGN PATENT DOCUMENTS

CN 1347632 A 5/2002
JP 2000-307297 A 11/2000
(Continued)

OTHER PUBLICATIONS

International Search Report dated Sep. 15, 2015, in PCT/JP2015/068013 filed on Jun. 23, 2015.

*Primary Examiner* — Adam D Houston
(74) *Attorney, Agent, or Firm* — Oblon, McClelland, Maier & Neustadt, L.L.P.

(57) ABSTRACT

There is provided a power supply device for a work unit that supplies power to multiple work units constituting a work device as power supply targets, the device including: a first power supply line through which power supply is stopped when an emergency stop condition is satisfied and a second power supply line through which power supply is not stopped even when the emergency stop condition is satisfied, in which the first power supply line and the second power supply line can be used individually according to a difference in a safety structure of each work unit. According to this, when the emergency stop condition is satisfied, it is possible to reduce the restoration time required when the emergency stop is eliminated while guaranteeing the safety of the entire work device configured by the multiple work units.

20 Claims, 3 Drawing Sheets

(51) Int. Cl.
*H05K 13/04* (2006.01)
*H05K 13/08* (2006.01)

(52) U.S. Cl.
CPC ..... *H05K 13/0417* (2013.01); *H05K 13/0885* (2018.08); *H05K 13/08* (2013.01)

(56) References Cited

U.S. PATENT DOCUMENTS

| | | | | |
|---|---|---|---|---|
| 2002/0037211 | A1* | 3/2002 | Korycan | B60P 1/167 414/501 |
| 2010/0315738 | A1* | 12/2010 | Yamashita | G11B 21/12 360/71 |
| 2012/0080944 | A1* | 4/2012 | Recker | H02J 9/02 307/25 |
| 2012/0126790 | A1* | 5/2012 | Sobotka | G01D 4/002 324/119 |
| 2012/0148005 | A1* | 6/2012 | Fujimoto | G21C 9/02 376/219 |
| 2012/0262093 | A1* | 10/2012 | Recker | H05B 33/0854 315/308 |
| 2012/0262106 | A1* | 10/2012 | Omiya | B60R 16/03 320/104 |
| 2013/0303105 | A1* | 11/2013 | Jo | H04N 7/183 455/404.1 |
| 2014/0210269 | A1* | 7/2014 | Kwon | H02J 9/06 307/64 |
| 2014/0320011 | A1* | 10/2014 | Hegarty | G01R 31/367 315/86 |
| 2015/0114574 | A1* | 4/2015 | Fiedler | E05F 15/71 160/7 |
| 2015/0333351 | A1* | 11/2015 | Nakamura | H01M 8/0494 700/287 |
| 2016/0126738 | A1* | 5/2016 | Moore | H02J 3/18 361/35 |
| 2017/0325351 | A1* | 11/2017 | Hesse | H05K 7/1487 |
| 2017/0349039 | A1* | 12/2017 | Rayner | B60L 53/68 |
| 2018/0019615 | A1* | 1/2018 | Wilson | H02J 9/005 |
| 2018/0052434 | A1* | 2/2018 | Maekawa | G06F 11/00 |
| 2018/0191193 | A1* | 7/2018 | Yamamoto | H05K 13/02 |
| 2018/0339880 | A1* | 11/2018 | Kattainen | B66B 5/0087 |
| 2018/0339881 | A1* | 11/2018 | Kattainen | B66B 5/0087 |
| 2018/0364670 | A1* | 12/2018 | Dotson | G05B 9/02 |
| 2019/0028886 | A1* | 1/2019 | Deixler | H04W 8/186 |
| 2019/0098723 | A1* | 3/2019 | Sadwick | H05B 33/0866 |

FOREIGN PATENT DOCUMENTS

| | | |
|---|---|---|
| JP | 2003-264399 A | 9/2003 |
| JP | 2015-76536 A | 4/2015 |

\* cited by examiner

WORK UNIT POWER SUPPLY DEVICE

TECHNICAL FIELD

The present disclosure relates to a work unit power supply device that supplies power to multiple work units constituting various work devices as power supply targets.

BACKGROUND ART

Solder printing machines, component mounting machines, reflow machines, board inspection machines, and the like are available as equipment for performing board production operations. It is common to constitute a board production line by these facilities being connected to each other. Among them, the component mounting machine includes three work devices, that is, aboard conveyance device, a component supply device, and a component transfer device. As multiple component supply units constituting the component supply device, there are feeder units with a configuration for feeding a carrier tape accommodating a large number of components at a predetermined pitch, a tray unit of a system for supplying a large number of components on a tray, and the like. Here, the power supply of the motor and control section for feeding the carrier tape and moving the tray is generally supplied from the power supply device provided in the main body of the component mounting machine. Technical examples relating to a power supply configuration inside a component mounting machine are disclosed in PTL 1 and PTL 2.

The electronic component mounting machine of PTL 1 includes a mounting operation essential constituent section having a mounted object holding and moving device (board conveyance device), a component supply device, and a component transfer device, and a control device; the control device selects a device from the mounting operation essential constituent section and shuts off electric power supply to the selected device according to each state among a normal state, an operation standby state, a non-normal state, and a partly stopping state of the electronic component mounting machine. According to this, electric power consumption can be reduced as compared with the related art.

In addition, the electronic component mounting machine of PTL 2 includes a component supply device having a power supply device for moving and a power supply device for control, a component transfer device having a power supply device for moving and a power supply device for control, and a control device; the control device shuts off electric power supply to at least one of the power supply devices for moving and maintains electric power supply to at least one of the power supply devices for control when the control device is stopped for reasons other than shut-off of the electric power. According to this, it is possible to shut off the power supply for moving to a driving device that is stopped and continue a production operation using the minimum necessary electric power.

CITATION LIST

Patent Literature

PTL 1: JP-A-2003-264399
PTL 2: JP-A-2000-307297

BRIEF SUMMARY

Problem to be Solved

Although the technologies of PTL 1 and PTL 2 shut off the power supply aiming for power-saving operation of the component mounting machine, there is also a need to control supply and shut-off of the power supply from different viewpoints such as safety and workability. More specifically, multiple types of components mounted on the board have various shapes and are different in size. Therefore, in many cases, there is a case where the component supply device is configured from a combination of multiple types of component supply units having different methods and structures. For example, one component supply device may be configured by a component supply unit with high safety whose entirety of a movable section driven by the motor is surrounded by a housing, and a component supply unit with low safety for which the movable section is exposed. Although there was a standard that a motor having a small capacity is safe, this standard has been abolished. Therefore, when an emergency stop condition is satisfied, it is necessary to shut off the power supply in order to ensure the safety of a component supply unit with low safety.

However, when the power supply to a component supply unit with low safety is shut off, the power supply to a component supply unit with high safety for which it is unnecessary to shut off the power supply is also shut off. This causes, for example, an adverse effect that the holding force of the motor is interrupted, and thus the position of the component is deviated. In this case, when the emergency stop is eliminated and the power supply is restored, positioning of the component needs to be performed, workability is reduced, and the restoration time is prolonged. Further, some components may be discarded in order to perform positioning.

As a solution to this problem, it is possible to provide a power supply switch in a power supply lead-in section of the component supply unit with low safety and perform individual shut-off of the power supply for each component supply unit based on the emergency stop signal. However, with this solution, as opposed to the single power supply switch in the related art, it is necessary to have a quantity of power supply switches equal to the number of units, therefore costs increase. Further, the addition of the power supply switches makes it difficult to downsize the component supply unit.

Problems caused by the differences in the safety of the multiple work units described above may also occur with work devices other than component supply devices.

The disclosure is made in view of the above problems of the background art and an object of the disclosure is to provide a work unit power supply device that can reduce restoration time required when an emergency stop is eliminated while guaranteeing safety of the entire work devices configured by multiple work units when the emergency stop condition is satisfied.

Means for Solving the Problem

In order to solve the problems described above, according to the disclosure, there is provided a work unit supply device that supplies power to multiple work units constituting a work device as power supply targets, the device including: a first power supply line through which power supply is stopped when an emergency stop condition is satisfied and a second power supply line through which power supply is not stopped even when the emergency stop condition is satisfied, in which the first power supply line and the second power supply line can be used individually according to a difference in a safety structure of each work unit.

Advantageous Effects

A power supply device for a work unit according to the disclosure includes a first power supply line through which power supply is stopped and a second power supply line through which power supply is not stopped, when an emergency stop condition is satisfied. Therefore, each work unit may receive power from either the first power supply line or the second power supply line according to the difference in a safety structure. In other words, a work unit with low safety can stop operation when an emergency stop condition is satisfied by receiving power from the first power supply line, and thus guarantee safety. On the other hand, a work unit with high safety maintains the current state even if the emergency stop condition is satisfied by receiving power from the second power supply line, and thus the trouble of the restoration work can be reduced. Therefore, when the emergency stop condition is satisfied, it is possible to reduce the restoration time required when the emergency stop is eliminated while securing the safety of the entire work device configured by the multiple work units.

DETAILED DESCRIPTION

1. Overall Configuration of Component Mounting Machine 9

Figure 1:
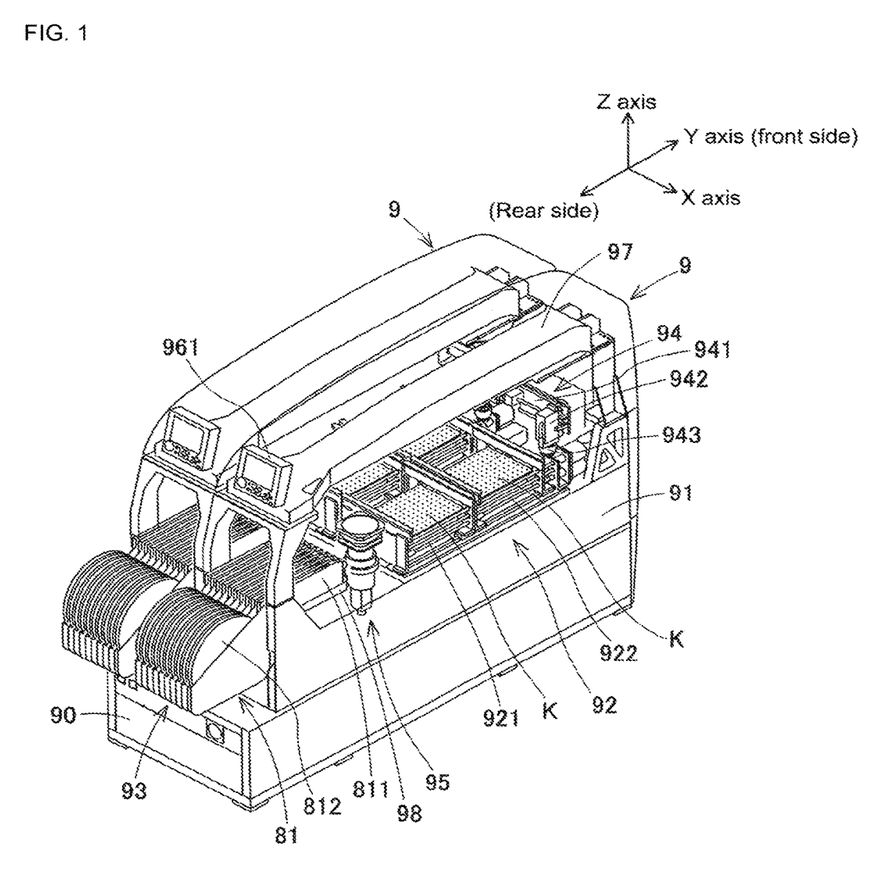
FIG. 1 is a perspective view illustrating the overall configuration of a component mounting machine equipped with a power supply device for a component supply unit according to a first embodiment.

A configuration of power supply device 1 for a component supply unit which is a first embodiment of a power supply device for a work unit of the disclosure will be described with reference to FIG. 1 and FIG. 2. FIG. 1 is a perspective view illustrating the overall configuration of component mounting machine 9 equipped with power supply device 1 for a component supply unit according to the first embodiment. Two component mounting machines 9 loaded on a common base 90 are illustrated in FIG. 1 and in the following description, and one component mounting machine on the front right side will be described with reference numerals. Component mounting machine 9 is configured by assembling board conveyance device 92, component supply device 93, component transfer device 94, camera device 95, control computer 96 (illustrated in FIG. 2), and the like to device table 91. As illustrated in the XYZ-axes in the upper right of FIG. 1, a horizontal width direction of component mounting machine 1 (direction from the upper left to the lower right in paper surface of FIG. 1) is referred to as the X-axis direction, a horizontal longitudinal direction of component mounting machine 1 (direction from the lower left to the upper right in paper surface of FIG. 1) is referred to as the Y-axis direction and a vertical height direction is referred to as the Z-axis direction.

Board conveyance device 92 is disposed so as to cross an upper face of device table 91 in the X-axis direction. Board conveyance device 92 is a so-called double conveyor type device in which two conveyance lanes 921 and 922 are arranged side by side. Each of the conveyance lanes 921 and 922 is configured by a pair of guide rails extending in parallel in the X-axis direction and a pair of conveyor belts which are guided by a guide rail or the like, respectively, on which boards K are placed, and which are rotated. Further, each of the conveyance lanes 921 and 922 has a backup device that pushes up and positions the loaded board K.

Component supply device 93 is provided on a rear side (left front side in FIG. 1) of component mounting machine 9 in the longitudinal direction. Component supply device 93 corresponds to a work device. Component supply device 93 is configured by pallet member 98 and multiple feeder units 81. Pallet member 98 includes a flat surface section having multiple slots and an upright section protruding upwards at the front side of the flat surface section. Pallet member 98 is detachably mounted or fixed on the upper side of the device table 91.

Feeder unit 81 includes main body section 811 and supply reel 812 which is rotatably and detachably mounted to a rear section of main body section 811. In the multiple feeder units 81, lower sides of each of main body sections 811 are fitted and mounted in the slots of pallet member 98 and are arranged in the X-axis direction. Carrier tape accommodating and holding a large number of components at a predetermined pitch is wound on supply reel 812. Feeder unit 81 feeds the carrier tape by driving section 811 (illustrated in FIG. 2) to supply small-sized components.

Figure 2:
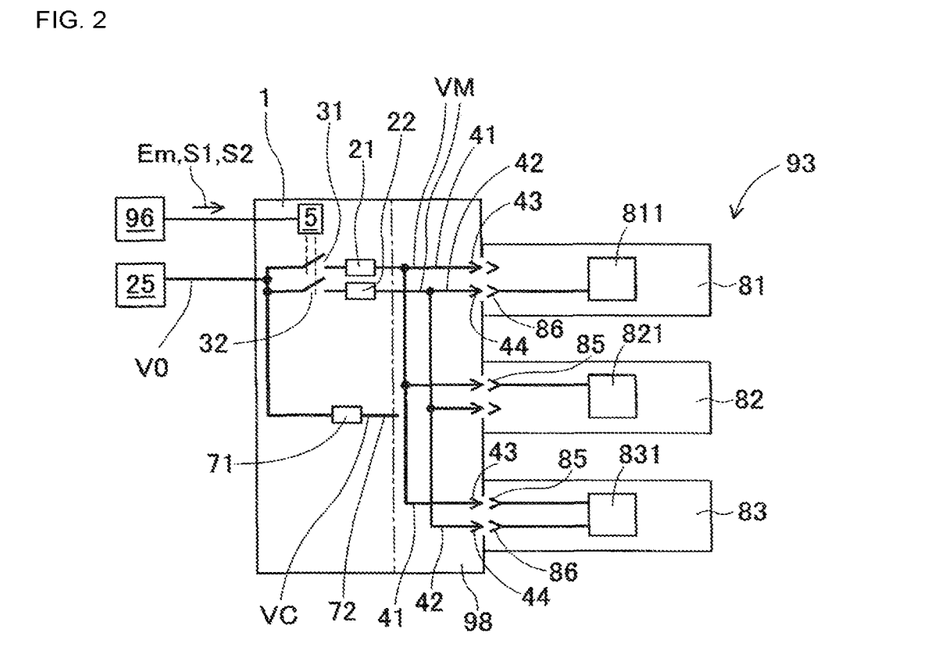
FIG. 2 is a single wire connection diagram illustrating the configuration of the power supply device for the component supply unit according to the first embodiment.

Component supply device 93 can be configured by replacing a portion or all of feeder units 81 with medium-sized feeder unit 82 (illustrated in FIG. 2). Medium-sized feeder unit 82 includes a main body section and a supply reel and feeds carrier tape by driving section 821 (illustrated in FIG. 2) to supply medium-sized components. Further, component supply device 93 can be configured by replacing some of the feeder units 81 with one tray unit 83 (illustrated in FIG. 2). Tray unit 83 operates a tray by driving section 831 (illustrated in FIG. 2), and supplies large-sized components on the tray.

The type and the quantity of the component supply units constituting component supply device 93 can be changed at any time by replacement. Feeder unit 81, medium-sized feeder unit 82, and tray unit 83 correspond to work units.

Component transfer device 94 is a so-called XY-mobile robot type device that is movable in the X-axis direction and the Y-axis direction. Component transfer device 94 is disposed from above board conveyance device 92 to above component supply device 93. Component transfer device 94 is configured from head driving mechanism 941, mounting head 942, mounting nozzle 943, and the like. Head driving mechanism 941 drives mounting head 942 in the X-axis direction and the Y-axis direction in the horizontal plane. Head driving mechanism 941 can be configured by suitably employing various known techniques. Mounting head 942 has mounting nozzle 943 for picking up and mounting components on the lower side thereof.

Camera device 95 is provided pointing upward between board conveyance device 92 and component supply device 93 on the upper surface of device table 91. While mounting head 942 is moving from component supply device 93 to the board K, camera device 95 images and detects the state of the component held at the lower end of mounting nozzle 943. When camera device 95 detects an error of the holding position of the component, a deviation of the rotation angle, or the like, control device finely adjusts the component mounting operation as necessary.

Control device 96 is a computer device having a CPU and operating with software. Control device 96 is communicatively connected to board conveyance device 92, component supply device 93, component transfer device 94, and camera device 95. Control device 96 controls the overall operation of component mounting machine 9 by issuing commands while exchanging information with these devices 92 to 95 as appropriate. Specifically, control device 96 commands and controls loading and unloading of the board K by board conveyance device 92, component supply from component supply device 93, component pickup operation and component mounting operation of component transfer device 94, imaging operation of the camera device 95, and so on. In addition, control device 96 includes display operation section 961 for displaying information to the operator and to enable the operator to enter settings. Display operation section 961 is disposed on the upper rear side section of protective cover 97 seen in FIG. 1.

2. Configuration of Power Supply Device 1 for Component Supply Unit of First Embodiment Next, the configuration of power supply device 1 for the component supply unit of the first embodiment will be described. FIG. 2 is a single wire connection diagram illustrating the configuration of power supply device 1 for the component supply unit of the first embodiment. Power supply device 1 for the component supply unit is equipped inside device table 91 of component mounting machine 9. In power supply device 1 for the component supply unit, three types of feeder units: feeder unit 81, medium-sized feeder unit 82, and tray unit 83, which constitute component supply device 93, are set as power supply targets. In FIG. 2, examples the three types of component supply units 81, 82, and 83 are shown one by one. Power supply device 1 for the component supply unit actually supplies power to more than the three component supply units 81, 82, and 83.

Power supply device 1 for the component supply unit transforms power supply voltage V0 of upper power supply 25 to generate power voltage VM and supplies the power voltage VM to each of the component supply units 81, 82, and 83. Power supply device 1 for the component supply unit is configured from first power supply circuit 21, second power supply circuit 22, first power supply switch 31, second power supply switch 32, first power supply line 41, second power supply line 42, power supply control section 5, and so on. Power supply device 1 for the component supply unit further includes control power supply circuit 71 and control power supply line 72. In FIG. 2, the power supply lines of each of the sections are indicated by bold lines (same applies to FIG. 3 to FIG. 5).

First power supply circuit 21 transforms power supply voltage V0, generates power voltage VM, and supplies the power voltage VM to first power supply line 41. Similarly, second power supply circuit 22 transforms power supply voltage V0, generates power voltage VM, and supplies the power voltage VM to second power supply line 42. Naturally, it is preferable that the power voltage VM is stable. However, it may be allowed that power voltage VM fluctuates overtime or that power voltage VM fluctuates depending on the number of connected units within a range where each of the component supply units 81, 82, and 83 can operate satisfactorily. In addition, power voltages VM supplied to first power supply circuit 21 and second power supply circuit 22 may be different from each other, as a condition that each of the component supply units 81, 82, and 83 can operate satisfactorily.

As power supply voltage V0 of upper power supply 25, single-phase or three-phase alternating current 200V may be used, but the disclosure is not limited thereto. Further, a rated value of power voltage VM can be DC 48 V, for example, but the disclosure is not limited thereto. First power supply circuit 21 and second power supply circuit 22 are configured by series connection of a full-wave rectification circuit in which rectifier diodes are bridge-connected and a DC step-down circuit of a switching method or dropper type, for example.

First power supply switch 31 opens and closes between upper power supply 25 and first power supply circuit 21. Similarly, second power supply switch 32 opens and closes between upper power supply 25 and second power supply circuit 22. First power supply switch 31 and second power supply switch 32 are controlled to be opened and closed by power supply control section 5. As first power supply switch 31 and second power supply switch 32, relays for power opening and closing may be used, but the disclosure is not limited thereto.

First power supply line 41 is wired from first power supply circuit 21 to the upright section of pallet member 98. The upright section of pallet member 98 has a power supply connector corresponding to each component supply unit to be mounted. First power supply line 41 is wired across first power feeding pin 43 of each power supply connector. Similarly, second power supply line 42 is wired from second power supply circuit 22 to the upright section of pallet member 98. Further, second power supply line 42 is wired across second power feeding pin 44 of each power supply connector.

Meanwhile, the three kinds of component supply units 81, 82, and 83 include power receiving connectors on the surface facing the upright section of pallet member 98. The power receiving connector has first power receiving pin 85 facing first power feeding pin 43 and second power receiving pin 86 facing second power feeding pin 44. When component supply units 81, 82, and 83 are mounted on pallet member 98, first power feeding pin 43 and first power receiving pin 85 are electrically connected and second power feeding pin 44 and second power receiving pin 86 are electrically connected to each other. Therefore, first power supply line 41 and second power supply line 42 are electrically connected to the power receiving connector via the power supply connector and can be individually used on the side of each of component supply units 81, 82, and 83.

Feeder unit 81 has a power load such as a motor or the like in driving section 811 that feeds the carrier tape. Driving section 811 is connected to second power receiving pin 86 and power is supplied only from second power supply line 42. Driving section 811 of feeder unit 81 is entirely surrounded by the housing, and thus has high safety and it is not necessary to stop even at the time of the emergency stop at which the emergency stop condition is satisfied. Feeder unit 81 corresponds to the second type work unit.

Medium-sized feeder unit 82 also has a power load such as a motor or the like in driving section 821 that feeds the carrier tape. Driving section 821 is connected to first power receiving pin 85 and is supplied with power from only first power supply line 41. Driving section 821 of medium-sized feeder unit 82 is partially exposed and has low safety and it is necessary to stop driving section 821 at the time of emergency stop in order to ensure safety. Medium-sized feeder unit 82 corresponds to the first type work unit.

Tray unit 83 has multiple power loads in a driving section 831 for operating the tray. A portion of driving section 831 having high safety is connected to second power receiving pin 86 and the remaining portion thereof having low safety is connected to first power receiving pin 85. In other words, driving section 831 is supplied with power from both first power supply line 41 and second power supply line 42. Tray unit 83 corresponds to the third type work unit.

Based on three types of command signals from control device 96, that is, emergency stop signal Em, first power saving signal S1, and second power saving signal S2, power supply control section 5 controls opening and closing of first power supply switch 31 and second power supply switch 32. Power supply control section 5 can be configured using a controller for power control or a relay sequence circuit, for example. The function of power supply control section 5 will be described in the operation of power supply device 1 for the component supply unit described below.

When the emergency stop condition is satisfied by depressing an emergency stop button (not illustrated) or protective cover 97 being opened, control device 96 recognizes this as an emergency stop. Control device 96 issues the emergency stop signal Em to power supply control section 5 at the time of the emergency stop. Further, control device 96 grasps types and quantities of component supply units 81, 82, and 83 constituting component supply device 93. When component supply device 93 is configured only from feeder unit 81, control device 96 issues first power saving signal S1 to power supply control section 5. In addition, when component supply device 93 is configured only from medium-sized feeder unit 82, control device 96 issues the second power saving signal S2 to power supply control section 5.

Control power supply circuit 71 transforms power supply voltage V0, generates control voltage VC, and supplies the control voltage VC to control power supply line 72. As the control voltage VC, DC 24 V which is smaller than the power voltage VM may be used, but the disclosure is not limited thereto. Control power supply line 72 is wired up to the control power feeding pin (not illustrated) of each power supply connector of pallet member 98 and is electrically connected to control power receiving pins of power receiving connectors of component supply units 81, 82, and 83. Accordingly, the control loads of the microcomputer, the sensor and the like are driven in component supply units 81, 82, and 83.

3. Operation and Action of Power Supply Device 1 for Component Supply Unit of First Embodiment)

Next, the operation of power supply device 1 for the component supply unit of the first embodiment will be described. Power supply control section 5 closes first power supply switch 31 and second power supply switch 32 in the normal operation mode in which no command signal is received from control device 96. Accordingly, first power supply circuit 21 and second power supply circuit 22 generate and supply the power voltage VM.

In emergency stop mode when emergency stop signal Em is received from control device 96, power supply control section 5 can open first power supply switch 31 and maintain the closed state of the second power supply switch 32. According to this, the power supply to first power supply circuit 21 is stopped when the emergency stop condition is satisfied. On the other hand, power supply to second power supply circuit 22 is not stopped even when the emergency stop condition is satisfied and power supply thereto is maintained. In the emergency stop mode, medium-type feeder unit 82 supplied with power only from first power supply circuit 21 and first power supply line 41 is stopped to ensure safety.

On the other hand, feeder unit 81 supplied with power only from second power supply circuit 22 and second power supply line 42 maintains power supply even in the emergency stop mode and performs an operation suitable for the emergency stop. Here, since component transfer device 94 is stopped at the time of an emergency stop, feeder unit 81 does not need to perform a component supply action, and operates so as to reduce the restoration work at the time of power restoration. Specifically, feeder unit 81 maintains the holding force of the motor in driving section 811 to guarantee the current position of the component and work of aligning the components is not required at the time of power restoration.

In addition, tray unit 83 maintains the power supply to a portion of driving section 831 having high safety and the remaining portion thereof having low safety is stopped. By stopping the portion of tray unit 83 having low safety and stopping medium-sized feeder unit 82, the safety of the whole component supply device 93 is guaranteed at the time of the emergency stop. When the emergency stop signal Em from control device 96 is eliminated, power supply control section 5 closes first power supply switch 31 and returns to the normal operation mode.

In addition, power supply control section 5 opens first power supply switch 31 and closes second power supply switch 32 in the first power saving mode when first power saving signal S1 from control device 96 is received. Accordingly, first power supply circuit 21 is stopped and second power supply circuit 22 supplies power. The first power saving mode is an operation mode when component supply device 93 is configured only of feeder units 81. In the first power saving mode, first power supply circuit 21 that is not connected to the power supply target is stopped and a power saving effect is generated.

Although the operation state of power supply device 1 for the component supply unit in the first power saving mode is the same as that at the time of the emergency stop mode, there is a difference in the duration of time. In other words, there are often cases where the emergency stop mode is eliminated within a relatively short time, whereas the first power saving mode continues until the configuration of component supply device 93 is changed.

Further, power supply control section 5 closes first power supply switch 31 and opens second power supply switch 32 in the second power saving mode when second power saving signal S2 is received from control device 96. Accordingly, first power supply circuit 21 supplies power and second power supply circuit 22 is stopped. The second power saving mode is an operation mode when component supply device 93 is configured only of medium-sized feeder units 82. In the second power saving mode, second power supply circuit 22 that is not connected to the power supply target is stopped and generates a power saving effect. The second power saving mode also continues until the configuration of component supply device 93 is changed. As can be understood from the description of the first and second power saving modes, power supply control section 5 performs the function of the power saving control section.

Figure 3:
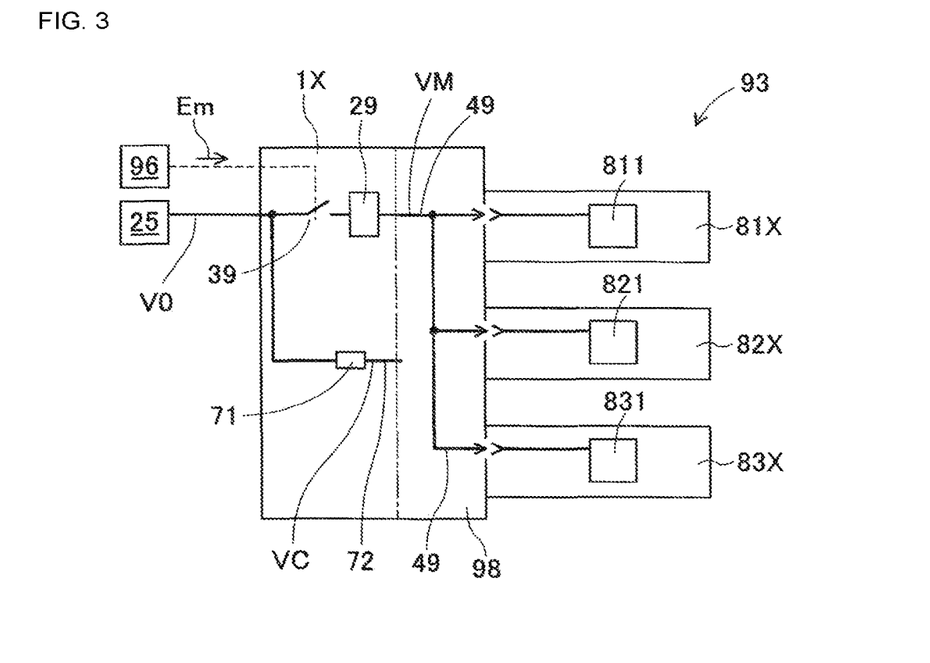
FIG. 3 is a single wire connection diagram illustrating the configuration of a power supply device for the component supply unit of the related art.

Next, the operation of power supply device 1 for the component supply unit of the first embodiment will be described in comparison with the related art and the reference form. FIG. 3 is a single wire connection diagram illustrating a configuration of a power supply device 1X for a component supply unit of the prior art. As illustrated in the drawing, power supply device 1X for the component supply unit of the prior art includes power supply switch 39, power supply circuit 29, and power supply line 49 of one system and supplies power to each of the component supply units 81X, 82X, and 83X. Power supply switch 39 is opened by the emergency stop signal Em from control device 96 and the power supply circuit 29 is stopped. According to this, at the time of the emergency stop, medium-sized feeder unit 82X and tray unit 83X other than feeder unit 81X are stopped to ensure safety.

However, in the related art, the power supply of feeder unit 81X which is not required to shut off the power supply at the time of emergency stop is also shut off together. This causes an adverse effect that the holding force of the motor of driving section 811 is interrupted, and thus the position of the component is deviated. Then, when the emergency stop is eliminated and the power supply is restored, positioning of the component needs to be performed, the workability is reduced, and the restoration time is prolonged. Further, some components may be discarded for positioning.

In contrast to the prior art, power supply device 1 for the component supply unit of the first embodiment is different from that of the related art in that the power supply of feeder unit 81 is not shut off even at the time of the emergency stop. This ensures the current position of the components at feeder unit 81, and thus when the emergency stop is eliminated aligning the components is not necessary.

Figure 4:
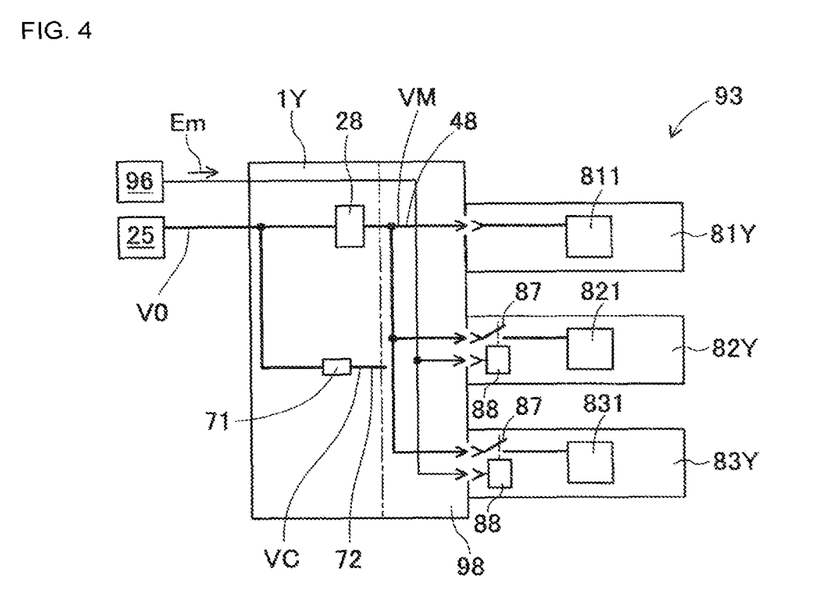
FIG. 4 is a single wire connection diagram illustrating a configuration of a power supply device for a component supply unit according to a reference form.

In addition, FIG. 4 is a single wire connection diagram illustrating the configuration of power supply device 1Y for the component supply unit of the reference form. As illustrated, power supply device 1Y for the component supply unit of the reference form does not include a power supply switch, but includes power supply circuit 28 and power supply line 48 of one system, and supplies power to each of the component supply units 81Y, 82Y, and 83Y. In addition, power supply device 1Y for the component supply unit relays emergency stop signal Em from control device 96 to medium-sized feeder unit 82Y and tray unit 83Y.

On the other hand, medium-sized feeder unit 82Y and tray unit 83Y include unit power supply switch 87 and unit control section 88, respectively. Unit power supply switch 87 is disposed between the power supply lead-in section electrically connected to power supply line 48 and driving sections 821 and 831. Upon receiving emergency stop signal Em from control device 96, unit control section 88 performs control to open unit power supply switch 87. According to this, at the time of the emergency stop, medium-sized feeder unit 82Y and tray unit 83Y other than feeder unit 81Y are stopped and safety is guaranteed.

However, in power supply device 1Y for the component supply unit of the reference form, since unit power supply switch 87 and unit control section 88 are required for medium-sized feeder unit 82Y and tray unit 83Y, respectively, the cost increases. Further, the addition of power supply switch 87 makes it difficult to reduce the size of medium-sized feeder unit 82Y. In particular, since it is difficult to make medium-sized feeder unit 82Y thin and the number of units mounted on pallet member 98 is limited, it is not possible to meet the requirement of increasing the number of types of components to be supplied.

In contrast to the reference form, power supply device 1 for the component supply unit of the first embodiment is different from that of the reference form in that two power supply switches 31 and 32 and one power supply control section 5 are used instead of the large number of unit power supply switches 87 and unit control section 88. Thus, in the first embodiment, the cost of power supply device 1 and component supply device 93 is lower than that of the reference form. Further, since the reduction in thickness of medium-sized feeder unit 82 is not hindered, it is advantageous in terms of increasing the number of types of components to be supplied.

4. Aspects and Effects of Power Supply Device 1 for Component Supply Unit of First Embodiment According to the first embodiment, there is provided power supply device 1 for the component supply unit (power supply device for work unit) which supplies power by using multiple component supply units 81, 82, and 83 (work unit) which are equipped in component mounting machine 9 and constitute component supply device 93 (work device) as power supply targets, the device including: first power supply line 41 through which power supply is stopped when an emergency stop condition is satisfied; and second power supply line 42 through which power supply is not stopped even when an emergency stop condition is satisfied, in which the first power supply line 41 and the second power supply line 42 can be individually used according to a difference in a safety structure of each of the component supply units 81, 82, and 83.

According to this, each of the component supply units 81, 82, and 83 may receive power from either first power supply line 41 or second power supply line 42 corresponding to the difference in safety structure. In other words, by receiving power from first power supply line 41, medium-sized feeder unit 82 having low safety can stop an operation when an emergency stop condition is satisfied and guarantee safety. On the other hand, by receiving power from second power supply line 42, feeder unit 81 having high safety can maintain the current state even if the emergency stop condition is satisfied, and thus the trouble of the restoration work can be reduced. Therefore, when the emergency stop condition is satisfied, it is possible to reduce the restoration time required when the emergency stop is eliminated while the overall safety of the component supply device 93 is guaranteed. In addition, in feeder unit 81, there is no need to discard some components in order to perform alignment of the position thereof.

Further, power supply device 1 for the component supply unit uses medium-sized feeder unit 82 (first type work unit) which has low safety and is supplied with power from only first power supply line 41, feeder unit 81 (second type work unit) which has high safety and is supplied with power only from second power supply line 42, and tray unit 83 (third type work unit) which includes a portion having low safety and a portion having high safety and is supplied with power from both first power supply line 41 and second power supply line 42, as power supply targets. According to this, regardless of how the configuration of component supply device 93 changes, the entire safety can be guaranteed at the time of the emergency stop.

Further, first power supply circuit 21 that supplies power to first power supply line 41 and stops power supply when an emergency stop condition is satisfied, and second power supply circuit 22 that supplies power to second power supply line 42 are further provided in power supply device 1 for the component supply unit. According to this, since the bisected power supply circuits 21 and 22 can be downsized, the degree of freedom of the disposition space equipped in component mounting machine 9 is large.

Further, component supply device 93 is configured so that multiple component supply units 81, 82, and 83 can be replaced, and power supply control section 5 (power saving control section) is further included which implements a first power saving mode in which first power supply circuit 21 is stopped when component supply device 93 is configured only of the feeder unit 81 (second type work unit) and a second power saving mode in which second power supply circuit 22 is stopped when component supply device 93 is configured only of the medium-sized feeder unit 82 (first type work unit). According to this, power can be supplied in the power saving mode according to the configuration of component supply device 93, and thus a power saving effect is generated.

5. Power Supply Device 1A for Component Supply Unit of Second Embodiment

Figure 5:
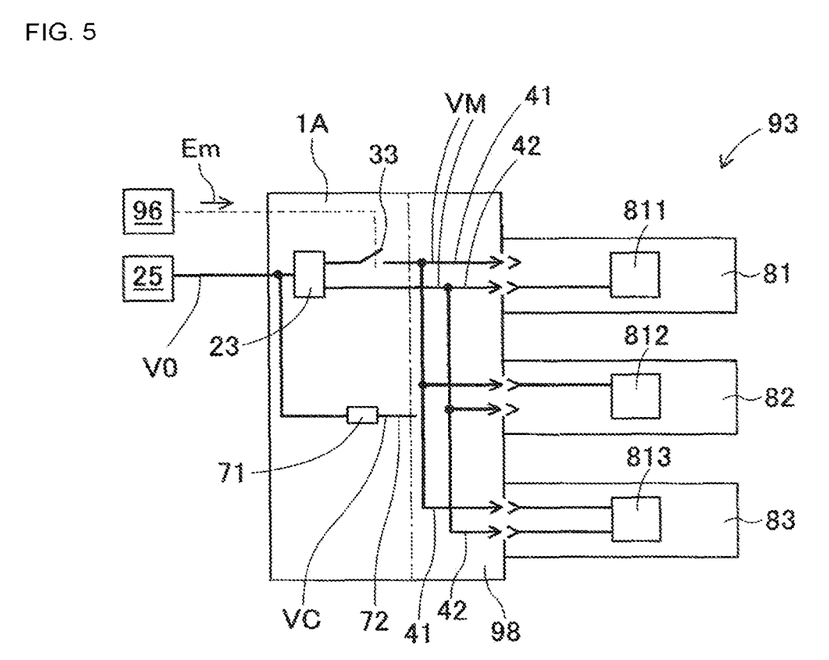
FIG. 5 is a single wire connection diagram illustrating a configuration of a power supply device for a component supply unit according to a second embodiment.

Next, differences between the power supply device 1A for the component supply unit which is the second embodiment of the power supply device for the work unit of the disclosure and that of the first embodiment will be mainly described. FIG. 5 is a single wire connection diagram illustrating the configuration of power supply device 1A for the component supply unit of the second embodiment. Power supply device 1A for the component supply unit according to the second embodiment is configured by common power supply circuit 23, emergency shut-off switch 33, first power supply line 41, second power supply line 42, and the like. Power supply device 1A for the component supply unit further includes control power supply circuit 71 and control power supply line 72.

Common power supply circuit 23 transforms power supply voltage V0 of upper power supply 25 to generate power voltage VM and supplies the power voltage VM to first power supply line 41 and second power supply line 42. Emergency shut-off switch 33 is opened and closed between common power supply circuit 23 and first power supply line 41. Emergency shut-off switch 33 is opened by emergency stop signal Em issued by control device 96 when the emergency stop condition is satisfied. Accordingly, power supply to first power supply line 41 is stopped when the emergency stop condition is satisfied. On the other hand, the power supply to second power supply line 42 is not stopped even when the emergency stop condition is satisfied and the power supply is maintained.

In the second embodiment, the operation of ensuring the overall safety of component supply device 93 at the time of emergency stop is the same as in the first embodiment. In addition, in the second embodiment, the operation of ensuring the current position of the components by feeder unit 81 at the time of the emergency stop and eliminating the need for the alignment work of the components at the time of restoring power is also the same as in the first embodiment. However, in the second embodiment, the control of the first and second power saving modes is not performed.

Power supply device 1A for component supply unit (power supply device for work unit) of the second embodiment includes common power supply circuit 23 that supplies power to first power supply line 41 and second power supply line 42, and emergency shut-off switch 33 for shutting off first power supply line 41 when the emergency stop condition is satisfied. According to this, unlike the first embodiment, since common power supply circuit 23 having one large power supply capacity is used, the power supply efficiency becomes better as compared with the first embodiment.

6. Application and Modification of Embodiments

In the first and second embodiments, power supply devices 1 and 1A for the component supply unit may supply power to the work units which are equipped in component mounting machine 9 and which are added as power supply targets in addition to component supply units 81, 82, and 83. For example, a component disposal conveyor unit, an adhesive supply unit, a solder supply unit and the like may be added as power supply targets and may be electrically connected to at least one of first power supply line 41 and second power supply line 42 corresponding to the level of safety of each.

In addition, in the vast majority of cases component supply device 93 is constituted only by feeder units 81, and there are almost no cases where component supply device 93 is constituted only by medium-sized feeder unit 82. Therefore, in the first embodiment, the function of the second power saving mode may be omitted, and only the power saving effect by the first power saving mode may be generated. Further, in the first and second embodiments, although control voltage VC is supplied individually from power voltage VM, the disclosure is not limited thereto. In other words, by making control voltage VC equal to power voltage VM, or by generating control voltage VC from power voltage VM inside component supply units 81, 82, and 83, the supply of control voltage VC via another route may be omitted. Various other applications and modifications are possible with the disclosure.

INDUSTRIAL APPLICABILITY

The work unit power supply device of the present disclosure can be used in work devices of various fields performing assembly, machining, or the like other than the component supply device described in the first and second embodiments.

REFERENCE SIGNS LIST

1, 1A: power supply device for component supply unit (power supply device for work unit), 21: first power supply circuit, 22: second power supply circuit, 23: common power supply circuit, 31: first power supply switch, 32: second power supply switch, 33: emergency shut-off switch, 41: first power supply line, 42: second power supply line, 5: power supply control section, 81: feeder unit (second type work unit), 82: a medium-sized feeder unit (first type work unit), 83: tray unit (third type work unit), 9: component mounting machine, 93: component supply device (work device), 96: control device, 98: pallet member, 1X: power supply device for component supply unit of prior art 1Y: power supply device for component supply unit of reference form

The invention claimed is:

1. A work unit power supply device that supplies power to multiple work units, the device comprising:
   a first power supply line;
   a second power supply line; and
   control circuitry configured to:
   stop the power from being supplied to the first power supply line when an emergency stop condition is satisfied, and
   supply the power to the second power supply line even when the emergency stop condition is satisfied.

2. The work unit power supply device according to claim 1, wherein
   a first type work unit, which has low safety, is supplied with the power from only the first power supply line,
   a second type work unit, which has high safety, is supplied with the power only from the second power supply line, a third type work unit which includes a portion having low safety and a portion having high safety, is supplied with the power from both the first power supply line and the second power supply line, and low safety is a measure of safety less than that of high safety.

3. The work unit power supply device according to claim 1, further comprising:

a first power supply switch connected to the first power supply line; and a second power supply switch connected to the second power supply line, wherein the control circuitry is configured to:

supply the power to the first power supply line by controlling the first power supply switch, stop the supply of power to the first power supply line when the emergency stop condition is satisfied by controlling the first power supply switch, and supply the power to the second power supply line even when the emergency stop condition is satisfied by controlling the second power supply switch.

4. The work unit power supply device unit according to claim 1, further comprising:

a first power supply switch connected to the first power supply line; and a second power supply switch connected to the second power supply line, wherein the control circuitry is configured to implement at least one mode of:

a first power saving mode in which the supply of the power is stopped by controlling the first power supply switch when the multiple work units are only work units of a second type, and a second power saving mode in which the supply of power is stopped by controlling the second power supply switch when the multiple work units are only work units of a first type, the work units of the second type are work units which have high safety and are supplied with the power only from the second power supply line, the work units of the first type are work units which have low safety and are supplied with the power from only the first power supply line, and low safety is a measure of safety less than that of high safety.

5. The work unit power supply device according to claim 1, wherein the emergency stop condition being satisfied includes receipt of an emergency stop signal by the control circuitry.

6. The work unit power supply device according to claim 1, wherein the emergency stop condition being satisfied includes depression of an emergency stop button.

7. The work unit power supply device according to claim 1, wherein the emergency stop condition being satisfied includes movement of a protective member.

8. A work unit power supply device that supplies power to multiple work units, the device comprising:

a first power supply line;

a second power supply line; and circuitry configured to stop the power from being supplied to the first power supply line when an emergency stop condition is satisfied, wherein the power is supplied to the second power supply line even when the emergency stop condition is satisfied.

9. The work unit power supply device according to claim 8, wherein a first type work unit, which has low safety, is supplied with the power from only the first power supply line, a second type work unit, which has high safety, is supplied with the power only from the second power supply line, a third type work unit, which includes a portion having low safety and a portion having high safety, is supplied with the power from both the first power supply line and the second power supply line, and low safety is a measure of safety less than that of high safety.

10. The work unit power supply device according to claim 8, further comprising a common power supply circuit configured to supply the power to the first power supply line and the second power supply line, wherein the circuitry includes an emergency shut-off switch configured to stop the power from being supplied to the first power supply line when the emergency stop condition is satisfied.

11. The work unit power supply device according to claim 8, wherein the emergency stop condition being satisfied includes receipt of an emergency stop signal by the circuitry.

12. The work unit power supply device according to claim 8, wherein the emergency stop condition being satisfied includes depression of an emergency stop button.

13. The work unit power supply device according to claim 8, wherein the emergency stop condition being satisfied includes movement of a protective member.

14. A system comprising:

a work device;

a plurality of work units connected to the work device;

a work unit power supply device that supplies power to the work units and includes a first power supply line and a second power supply line; and circuitry configured to configured to stop the power from being supplied to the first power supply line when an emergency stop condition is satisfied, wherein the power is supplied to the second power supply line even when the emergency stop condition is satisfied.

15. The system according to claim 14, wherein the work unit power supply device includes:

a first power supply switch connected to the first power supply line; and a second power supply switch connected to the second power supply line, and the circuitry is configured to:

supply the power to the first power supply line by controlling the first power supply switch, stop the supply of power to the first power supply line when the emergency stop condition is satisfied by controlling the first power supply switch, and supply the power to the second power supply line even when the emergency stop condition is satisfied by controlling the second power supply switch.

16. The system according to claim 14, wherein the work units include at least two of:

a first type work unit which has low safety and is supplied with the power from only the first power supply line, a second type work unit which has high safety and is supplied with the power only from the second power supply line, and a third type work unit which includes a portion having low safety and a portion having high safety and is supplied with the power from both the first power supply line and the second power supply line, and low safety is a measure of safety less than that of high safety.

17. The system according to claim 14, wherein the work unit power supply device includes:
- a first power supply switch connected to the first power supply line; and
- a second power supply switch connected to the second power supply line, the circuitry is configured to implement at least one mode of:
- a first power saving mode in which the supply of the power is stopped by controlling the first power supply switch when the multiple work units are only work units of a second type, and
- a second power saving mode in which the supply of power is stopped by controlling the second power supply switch when the multiple work units are only work units of a first type, the work units of the second type are work units which have high safety and are supplied with the power only from the second power supply line, the work units of the first type are work units which have low safety and are supplied with the power from only the first power supply line, and low safety is a measure of safety less than that of high safety.

18. The system according to claim 14, wherein the emergency stop condition being satisfied includes receipt of an emergency stop signal by the circuitry.

19. The system according to claim 14, wherein the emergency stop condition being satisfied includes depression of an emergency stop button.

20. The system according to claim 14, wherein the emergency stop condition being satisfied includes movement of a protective member.

* * * * *